United States Patent
Komai et al.

(10) Patent No.: US 6,380,065 B1
(45) Date of Patent: Apr. 30, 2002

(54) INTERCONNECTION STRUCTURE AND FABRICATION PROCESS THEREFOR

(75) Inventors: Naoki Komai; Shingo Kadomura, both of Kanagawa; Mitsuru Taguchi; Akira Yoshio, both of Tokyo; Takaaki Miyamoto, Kanagawa, all of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/435,624

(22) Filed: Nov. 8, 1999

(30) Foreign Application Priority Data

Nov. 11, 1998 (JP) .......................... 10-320115

(51) Int. Cl.⁷ .................... H01L 21/4763; H01L 21/44; H01L 21/302
(52) U.S. Cl. ................. 438/622; 438/639; 438/643; 438/688; 438/715
(58) Field of Search ................ 438/622, 639, 438/637, 643, 687, 688, 715, 619, 672, 678

(56) References Cited

U.S. PATENT DOCUMENTS

| | | | | |
|---|---|---|---|---|
| 5,098,860 A | * | 3/1992 | Chakravorty et al. | 438/628 |
| 5,354,712 A | * | 10/1994 | Ho et al. | 438/643 |
| 5,529,956 A | * | 6/1996 | Morishita | 438/639 |
| 5,851,915 A | * | 12/1998 | Miyakawa | 438/622 |
| 5,960,310 A | * | 9/1999 | Jeong | 438/622 |
| 5,966,634 A | * | 10/1999 | Inohara et al. | 438/687 |
| 5,981,378 A | * | 11/1999 | Bothra | 438/637 |
| 6,013,574 A | * | 1/2000 | Hause et al. | 438/622 |
| 6,037,248 A | * | 3/2000 | Ahn | 438/619 |
| 6,040,243 A | * | 3/2000 | Li et al. | 438/687 |
| 6,071,806 A | * | 6/2000 | Wu et al. | 438/622 |
| 6,077,768 A | * | 6/2000 | Ong et al. | 438/622 |
| 6,077,770 A | * | 6/2000 | Hsu | 438/622 |
| 6,080,669 A | * | 6/2000 | Iacoponi et al. | 438/672 |
| 6,093,654 A | * | 7/2000 | Koyama | 438/715 |
| 6,136,682 A | * | 10/2000 | Hedge et al. | 438/622 |
| 6,174,810 B1 | * | 1/2001 | Islam et al. | 438/687 |
| 6,218,302 B1 | * | 4/2001 | Braeckelmann et al. | 438/687 |

FOREIGN PATENT DOCUMENTS

| | | | | |
|---|---|---|---|---|
| JP | 405226281 A | * | 9/1993 | |
| JP | 405243222 A | * | 9/1993 | |
| JP | 405315336 A | * | 11/1993 | |
| JP | 406112331 A | * | 4/1994 | |
| JP | 406120212 A | * | 4/1994 | |
| JP | 406120215 A | * | 4/1994 | |

* cited by examiner

Primary Examiner—Caridad Everhart
Assistant Examiner—Chuoz Anh Luu
(74) Attorney, Agent, or Firm—Ronald P. Kananen; Rader, Fishman, & Grauer, PLLC

(57) ABSTRACT

In a related interconnection structure that is formed by filling a metal, there have been problems, since defective connection occurs due to generation of voids and other features caused by poor filling of the metal, which entails reduction in reliability, and contact resistance is large due to a barrier metal layer at a contact portion. A novel interconnection structure is provided which comprises: a recess (for example, a contact hole, a trench, or a trench and a contact hole formed at a bottom of the trench), which is connected onto a conductive material mass formed in an insulating film, and which is formed in the insulating film; a barrier metal layer formed on side walls of the recess; and metal material masses filled in the interior of the recess, wherein the metal material masses are formed with a metal repeatedly filled into the recess over a plurality of times, and a metal material mass and a conductive material mass are directly connected to each other.

8 Claims, 4 Drawing Sheets

INTERCONNECTION STRUCTURE AND FABRICATION PROCESS THEREFOR

BACKGROUND OF THE INVENTION

1. Field of the Invention

The present invention relates to an interconnection structure and a fabrication process therefor and more particularly to an interconnection structure that improves a filling performance of an interconnect material in itself and a fabrication process for the interconnection structure.

2. Description of the Related Art

Aluminum alloy has widely been adopted as an interconnect material for LSI. As a demand for miniaturization of LSI and its fast operating speed has been piled up, however, ensuring sufficient performances such as high reliability and low resistivity has increasingly become difficult with aluminum alloy interconnection. To cope with such a situation, a copper interconnection technique, because copper is excellent in electromigration resistance as compared with aluminum alloy, draws attention and is on the move toward practical use.

In formation of copper interconnects, since dry etching of copper generally is not easy, a fabrication process by means of trench interconnection is regarded as prospective. The trench interconnects are formed in a procedure such that predetermined trenches are in advance formed in an interlayer insulating film made of silicon oxide or the like, an interconnect material is filled into the trenches and thereafter, unnecessary portion of the interconnect material is removed by a chemical, mechanical polishing (hereinafter referred to as CMP, which is an abbreviation of Chemical Mechanical Polishing) or the like.

In the above described trench interconnect technique, various processes or methods for filling an interconnect material into the interior of contact holes and trenches have been studied, such as an electrolytic plating process, a chemical vapor deposition (hereinafter referred to as CVD, which is an abbreviation of Chemical Vapor Deposition) method, a reflow method and a high pressure reflow method, the latter two of which are effected after sputtering. Among them, an electrolytic plating process for copper which process has a high filling ability into the interiors of fine contact holes or trenches is regarded as an especially important technique.

Figure 4:
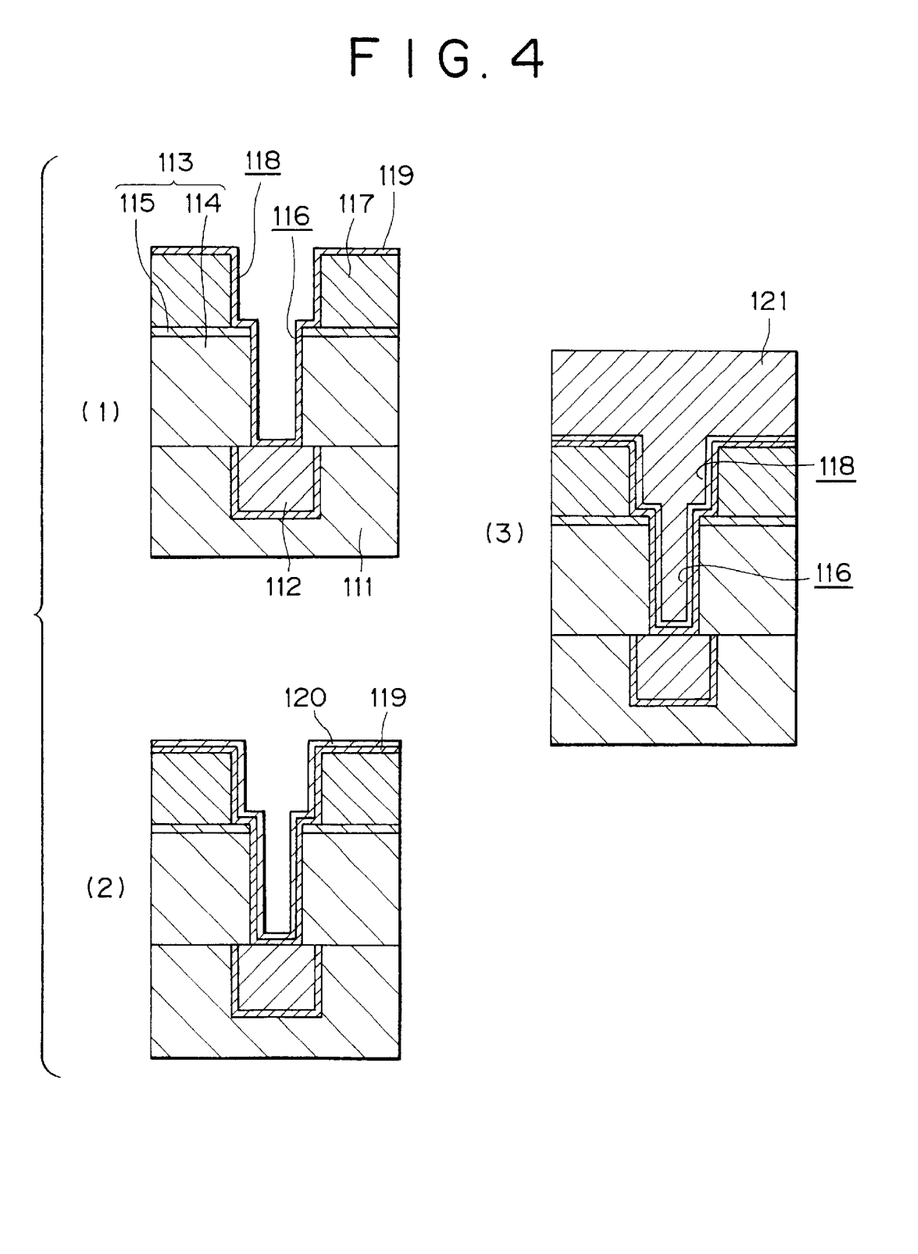

An example of a process in which copper is filled into trenches and contact holes by means of the electrolytic plating method will be described with reference to FIG. 4.

As shown in FIG. 4(1), after a predetermined element (not shown) is formed on a semiconductor substrate (not shown), an interlayer insulating film 111 is formed thereon and an lower layer interconnect 112 constituted of trench interconnection is further formed in the inter layer insulating film 111. An interlayer insulating film 113, between upper and lower layer interconnection, which covers the lower layer interconnect 112, is formed on the interlayer insulating film 111 with an oxide silicon film 114 and a silicon nitride film 115. Then, part of a contact hole 116 is formed in the silicon oxide film 114 and thereafter, an interlayer insulating film 117 is further formed. A trench 118, in which a trench interconnect is formed, is formed in the interlayer insulating film 117 and thereafter, the contact hole 116 is completed in the interlayer insulating film 113 so as to reach the lower layer interconnect 112. Subsequently, titanium nitride is deposited on inner walls of the trench 118 and a contact hole 116 to form a barrier metal layer 119 of 70 nm in thickness.

The barrier metal layer 119 has a blocking function against diffusion of copper into the interlayer insulating films made of silicon oxide or the like.

Then, as shown in FIG. 4(2), a seed layer 120 made of copper is deposited on the barrier layer 119 to a thickness of 100 nm by sputtering. The seed layer 120 functions as a seed in electrolytic plating conducted in a later step. Then, as shown in FIG. 4(3), copper 121 is filled into the interiors of the contact hole 116 and the trench 118 by means of an electrolytic plating process.

In the above described process, in order to realize good filling of copper 121, it is important to form the seed layer 120 in the respective interiors of the trench 118 and contact hole 116, so to speak, in a conformal manner. Furthermore, it is also significant to constantly supply a fresh plating solution into the respective interiors of the trench 118 and the contact hole 116.

However, decrease in interconnect line dimensions has progressed and a high aspect ratio, as a whole, of a trench and a contact hole combined has been a reality in a filling process in which the trench and the contact hole are simultaneously filled, by which a sputtering method has been hard to achieve a sufficient step coverage performance of a copper seed layer. In such circumstances, it is also difficult to constantly supply a fresh plating solution into respective interiors of a trench and a contact hole. In cases where step coverage of a copper seed layer is insufficient, or a fresh plating solution cannot sufficiently be supplied into the respective interiors of a trench and a contact hole in a continuous manner, voids or the like are produced in the respective interiors of a trench and a contact hole, thereby leading to poor filling. As a result, defective connection is provoked between a plug made of copper filled in the though-hole and a lower layer interconnect.

To cope with such inconvenience, methods have been studied of improving step coverage of copper in sputtering through improvement of an apparatus, For example, a long-distance sputtering in which a distance between a target and a substrate is increased and an ionization sputtering in which sputtered atoms are ionized to increase a fraction of vertical directionality in movement. A low-melting point metal material such as copper, however, is essentially poor in step coverage performance as compared with a high-melting point metal material such as tantalum nitride or titanium nitride and therefore, improvement of step coverage by the above described methods is not necessarily attained with ease. In a plating solution, on the other hand, while a process has been adopted in which wettability of the plating solution is increased by mixing an additive such as a surfactant into the plating solution, there is a limitation on improvement by increase in the wettability and a sufficient improvement of the filling characteristic of copper cannot be expected only by use of an additive.

Besides, in a structure in which a barrier metal layer is formed, since the barrier metal layer is formed between a lower layer interconnect and a copper plug formed in a contact hole, a contact resistance between the copper plug formed in the contact hole and the lower layer interconnect is increased.

SUMMARY OF THE INVENTION

The present invention is directed to an interconnection structure developed in order to solve the above described problem and a fabrication process therefor and the interconnection structure comprises: a recess, which is connected onto a conductive material mass formed in an insulating film, and which is formed in the insulating film, including a contact hole, or a trench, or a trench and a contact hole formed at a bottom of the trench; a barrier metal layer formed on side walls of the recess; and a metal material mass filled in the interior of the recess. The metal material mass is made of a metal that is repeatedly filled into the interior of the recess a plurality of times and the metal material mass is directly connected with the conductive material mass.

In the above described interconnection structure, a barrier metal layer is formed only on side walls of a recess and a lower portion of the metal material mass is directly connected to the conductive material mass at a bottom of the recess without a barrier layer interposed therebetween. Hence, a contact resistance between the conductive material mass and the lower portion of the metal material mass is low. Besides, the metal material mass is made of a metal that is repeatedly filled into the interior of the recess a plurality of times, which makes it possible to perform filling the metal into the interior of the recess by first effecting electroless plating, then followed by electrolytic plating. That is, in a case of a recess with a high aspect ratio, a first metal material mass is formed by means of electroless plating which has a high filling effectiveness, when an aspect ratio of the recess is lowered by formation of the first metal material mass, a seed layer is deposited, for example, by sputtering in a high step coverage state and thereafter, a second metal material mass can be formed by electrolytic plating whose deposition speed is high.

A first fabrication process for an interconnection structure comprises the steps of: forming a barrier metal layer on inner walls of a recess, for example, including a contact hole, a trench, or a trench and a contact hole formed at a bottom of the trench, which recess is connected onto a conductive material mass formed in an insulating film, and which recess is formed in the insulating film; exposing a conductive material mass at the bottom of the recess by removing the barrier metal layer formed at the bottom of the recess; forming a lower portion of a metal material mass by filling a metal into the interior of the recess; forming a seed layer by means of an electrolytic plating method on inner walls upward from the lower portion of the metal material mass; and forming an upper portion of the metal material mass by filling the metal into the interior of the recess by means of the electrolytic plating method.

In the first fabrication process for the interconnection structure, the lower portion of the metal material mass is formed after removing a portion, formed on the bottom, of the barrier metal layer formed in the recess. Hence, the lower portion of the metal material mass can be formed by electroless plating. Since an aspect ratio of the recess is reduced due to the presence of the lower portion of the metal material mass, step coverage of a seed layer by means of electrolytic plating, which is performed in a later step, is improved. As a result, the metal is satisfactorily filled into the recess by means of electrolytic plating, whereby no void occurs.

A second fabrication process for an interconnection structure comprises the steps of: forming a lower portion of a metal material mass by deposition of a metal into the interior of a recess, for example, including a contact hole, a trench, or a trench and a contact hole formed at a bottom of the trench, which recess is connected onto a conductive material mass formed in an insulating film, and which recess is formed in the insulating film; forming a barrier layer on inner walls of the recesses upward from the lower portion of the metal material mass; forming a seed layer by means of an electrolytic plating method on the inner walls of the recess; and forming an upper portion of the metal material mass by filling the metal into the interior of the recess by means of the electrolytic plating method.

In the above described second fabrication process, since an aspect ratio of the recess is reduced by the presence of the lower portion of the metal material mass formed by deposition of the metal into the interior of the recess, step coverage of a seed layer by electrolytic plating, which is performed in a later step, is improved. As a result, the metal is satisfactorily filled into the recess by electrolytic plating, whereby no void occurs.

BRIEF DESCRIPTION OF THE DRAWINGS

FIGS. 2(1) to 2(6) are schematic sectional views of structures in respective fabrication steps showing an embodiment pertaining to a first fabrication process for an interconnection structure;

FIGS. 3(1) to 3(4) are schematic sectional views of structures in respective fabrication steps showing an embodiment pertaining to a second fabrication process for an interconnection structure; and FIGS. 4(1) to 4(3) are schematic sectional views of structures in respective fabrication steps showing a related fabrication process for an interconnection structure.

DETAILED DESCRIPTION OF THE INVENTION

An embodiment pertaining to an interconnection structure of the present invention will be described with reference to a schematic sectional view of a structure of FIG. 1.

Figure 1:
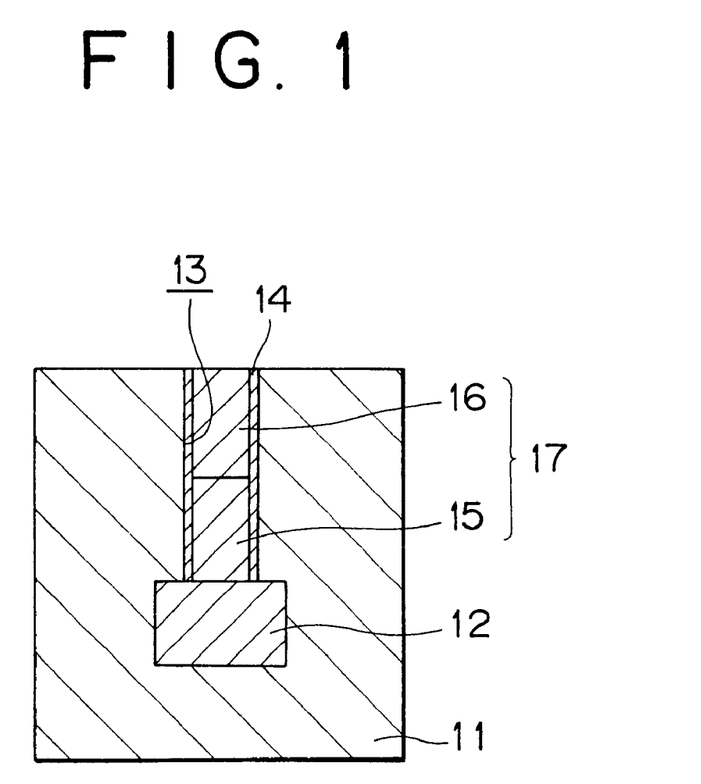
FIG. 1 is a schematic sectional view of a structure showing an embodiment pertaining to an interconnection structure of the present invention.

As shown in FIG. 1, a conductive material mass 12 which serves as a lower interconnect is formed in an insulating film 11 made of, for example, silicon oxide. A recess 13 connected with the conductive material mass 12 is further formed in the insulating film 11. The recess 13 includes, for example, a contact hole, a trench, or a trench and a contact hole formed at a bottom of the trench and the contact hole is herein shown as one example. A barrier metal 14 is formed on side walls of the recess 13. The barrier metal layer 14 is made of, for example, titanium nitride, a thickness thereof is, for example, 70 nm and the barrier metal layer 14 prevents copper from diffusing into the insulating film 11 made of silicon oxide or the like.

A metal material mass 15 is formed in the interior of the recess 13 in a state in which the metal material mass 15 is directly connected to the conductive material mass 12 without the barrier metal layer 14 interposed therebetween. Furthermore, a metal material mass 16, which is an upper portion of a plug, is formed in the interior of the recess 13 upward from the top of the metal material mass 15, which is a lower portion of the plug, and the metal material masses 15 and 16 constitute the plug 17.

In the above interconnection structure, the barrier metal layer 14 is formed on side walls of the recess 13 only and the metal material mass 15 is directly connected to the conductive material mass 12 at the bottom of the recess 13 without the barrier metal layer 14 interposed therebetween. Hence, a contact resistance between the conductive material mass 12 and the metal material mass 15 is low. Accordingly, the contact resistance between the plug 17 and the conductive material mass (for example, a lower layer interconnect) 12 which is a lower layer interconnect thereof is low as compared with a related interconnection structure in which a barrier metal layer is also formed on the bottom of the recess. It should be noted that, while in the above described structure, the metal material masses 15 and 16 constitute the plug 17, the metal material masses may be formed by filling repeated over a plurality of times.

In the above described structure, filling of the recess 13 with a metal is effected by the metal material mass 15 and the metal material mass 16. Therefore, it is possible to form the metal material mass 15 by electroless plating and form the metal material mass 16 by electrolytic plating. That is, the metal material mass 15 is formed in a state of a high aspect ratio by means of electroless plating, which is high in filling performance, until the aspect ratio of the recess 13 is lowered by deposition of the metal material mass 15. Thereafter, a seed layer is formed by, for example, sputtering in a state of high step coverage performance and the metal material mass 16 is then formed by electrolytic plating, which is fast in deposition speed.

Then, an embodiment pertaining to the first fabrication process for a interconnection structure will be described with reference to the schematic sectional views of structures in respective fabrication steps thereof of FIGS. 2(1) to 2(6).

As shown in FIG. 2(1), a predetermined element (not shown) is formed on a semiconductor substrate (not shown) and thereafter, an interlayer insulating film 21 is formed with a silicon oxide film by means of, for example, a plasma enhancement CVD method. Thereafter, a trench 22 is formed in the interlayer insulating film 21 by means of an ordinary forming technique for trench interconnection and then a barrier metal layer 23 is formed on inner walls of the trench 22. After formation of the barrier metal layer 23, the interior of the trench 22 is filled with copper by, for example, electrolytic plating. After the electrolytic plating, unnecessary copper is removed to form a lower interconnect (conductive material) 24 made of copper in the interior of the trench 22.

Then, an oxide silicon film 25 that covers the lower layer interconnect 24 is formed on the interlayer insulating film 21 to a thickness of, for example, 800 nm and a silicon nitride film 26 is further formed thereon to a thickness of, for example, 50 nm; thus an interlayer insulating film 27, which serves as an insulating film between upper and lower interconnects, (the interlayer insulating film 27 is hereinafter referred to as ILD, which is an abbreviation of Inter Level Dielectrics) is formed with the silicon oxide film 25 and the silicon nitride film 26. The silicon nitride film 26 exerts a function as an etching stopper in a later step.

Thereafter, by means of ordinary resist coating and lithography techniques, a resist mask (not shown) in which openings are formed at sites where contact holes are bored is formed and with the resist mask in place, etching is applied with the result that a portion of the contact hole 28 is formed in the silicon nitride film 26, wherein a diameter of a contact hole 28 was, for example, 0.3 µm.

After a portion of the contact hole 28 is formed, the resist mask is removed. Subsequently, as shown in FIG. 2(2), an interlayer insulating film 29 between interconnects in the same layer (the interlayer insulating film 29 is hereinafter referred to as IMD, which is an abbreviation of Inter Metal Dielectrics), which covers a part of the contact hole 28, is formed on the silicon nitride film 26 to a thickness of, for example, 500 nm by means of, for example, a plasma enhancement CVD method.

A resist mask (not shown) in which openings are formed at sites where trenches are bored is formed on the IMD 29 by means of ordinary resist coating and lithography techniques and with the resist mask in place, etching is applied with the result that a trench 30 is formed in the IMD 29. In the etching to form the trench 30, the silicon nitride film 26 serves as an etching stopper. Then, using the silicon nitride film 26 as an etching mask, the oxide film 25 is etched to form a contact hole 28, which leads to the lower layer interconnect 24, at the bottom of the trench 30. A recess 31 comprising the contact hole 28 and the trench 30 is formed in this way. The trench 30 was formed so as to have a width of, for example, 0.5 µm. Thereafter, the resist mask is removed.

Then, as shown in FIG. 2(3), a barrier metal layer 32 is formed by deposition of, for example, silicon nitride on inner walls of the recess 31 (the trench 30 and the contact hole 28) to a thickness of, for example, 70 nm using DC magnetron sputtering. At this time, the barrier metal layer 32 is also deposited on the IMD 29. The barrier metal layer 32 is formed, for example, under the following conditions: A process gas comprising argon (Ar) at a flow rate of 20 sccm and nitrogen ($N_2$) at a flow rate of 70 sccm is used, a pressure of a film forming atmosphere and a temperature in the film forming are respectively 0.3 Pa and 200° C., and DC power is set at 12 kV, wherein sccm hereinafter indicates a volume flow rate ($cm^3$/min) in the standard condition.

The barrier metal layer 32, as shown in FIG. 2(4), is etched back to expose the lower layer interconnect 24 at the bottom of the contact hole 28. That is, copper is exposed at the bottom of the contact hole 28. By the etching-back, the barrier metal layer 32 (not shown) formed on the IMD 29 is removed. The etching-back is conducted, for example, by reactive ion etching (hereinafter referred to as RIE, which is an abbreviation thereof) using an etching gas of a mixture composed of boron trichloride $BCl_3$ at a flow rate of 20 sccm, chlorine $Cl_2$ at a flow rate of 120 sccm, argon Ar at a flow rate of 60 sccm and helium He at a flow rate of 20 sccm under conditions of a pressure, for example 0.7 Pa, of an etching atmosphere, a supplied power set to 110 W and an etching time of, for example, 3 min.

Then, copper is deposited into the interior of the contact hole 28 to fill by means of an electroless plating method, as shown in FIG. 2(5). In the electroless plating method, a lower portion 33 of a metal material mass is formed by depositing copper starting from the bottom of the contact hole 28 with copper exposed at the bottom of the contact hole 28 as a catalyst. In this way, the contact hole 28 is selectively filled with copper to reduce an aspect ratio of the contact hole 28. As an example of the electroless plating, a procedure and its conditions were that 5 $dm^3$ of an electroless plating solution which was kept, for example, at 25° C. was prepared and electroless plating was effected, for example, for 10 min while stirring the electroless plating solution with 1 MHz ultrasonic waves.

Following the electroless etching, a seed layer 34 is formed on inner walls of the trench 30 and the contact hole 28 by copper deposition, for example, 100 nm in thickness using DC magnetron sputtering. In the deposition, the seed layer 34 is also deposited on the IMD 29. As an example of the sputtering, its conditions were that argon (Ar) at a flow rate of 50 sccm was used as a process gas, a pressure of a film forming atmosphere was set to 0.2 Pa and a film forming temperature was set to 200° C. and a supplied DC power was set to 12 kV. In the course, since a lower portion of the plug 22 had been formed on the bottom side of the contact hole 28, the contact hole 28 had a low aspect ratio at the time when the seed layer 34 was formed and a step coverage performance of the seed layer 34 at an upper portion of the side walls of the contact hole 28 was improved.

Copper, as shown in FIG. 2(6), is further filled into the interior of the contact hole 28 and the trench 30 by the electrolytic plating method. In the electrolytic plating method, copper is grown on the seed layer 34. After the growth of copper, unnecessary copper deposit on the IMD 29 is removed by CMP, whereby an upper portion 35 of the metal material mass is formed in the interior of the contact hole 28 upward from the lower portion 33 of the metal material mass and an upper layer interconnect 36 is formed in the interior of the trench 30. In this way, the plug 37 is constructed from the upper and lower portions 33 and 35 of the metal material mass. Note that in the above described CMP, the barrier metal layer 32 (not shown) on the IMD 29 is also eliminated.

Figure 2:
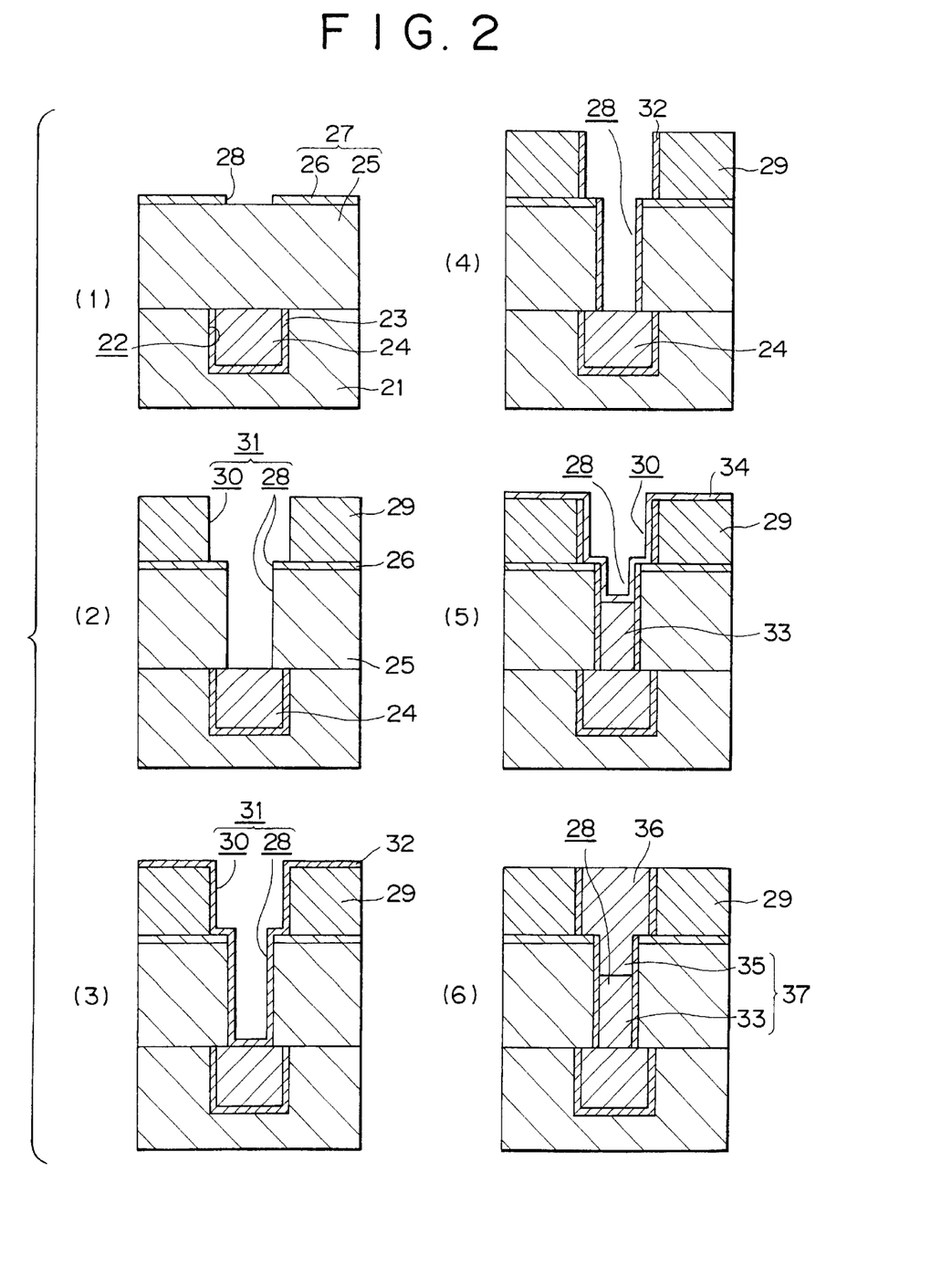

In the above described first process, the lower portion 33 of the metal material mass is formed after removing a portion, formed on the bottom, of the barrier metal layer 32 formed in the recess 31 and therefore, the lower portion 33 of the metal material mass can be formed by electroless plating. Since an aspect ratio of the recess 31 is reduced by filling of the lower portion 33 of the metal material mass, a step coverage performance of a seed layer 34 formed in a later step by electrolytic plating is improved. As a result, since copper is satisfactorily filled into the recess by electrolytic plating and the upper portion 35 of the metal material mass is thus formed, no void occurs in the recess 31.

Then, an embodiment pertaining to the second fabrication process for a interconnection structure will be described with reference to the schematic sectional views of structures in respective fabrication steps thereof of FIGS. 3(1) to 3(4).

As shown in FIG. 3(1), after a predetermined element (not shown) is formed on a semiconductor substrate (not shown), an interlayer insulating film 21 is formed with a silicon oxide film formed by means of, for example, a plasma enhancement CVD method. Subsequently, a trench 22 is formed in the interlayer insulating film 21 by means of an ordinary forming technique for trench interconnection and a barrier metal layer 23 is formed on inner walls of the trench 22. Then, copper is filled into the interior of the trench 22, for example, by electrolytic plating and thereafter, unnecessary copper is removed to form a lower layer interconnect (conductive material) 24 made of copper in the interior of the trench 22.

After formation of the lower layer interconnect 24, a silicon oxide film 25 covering the lower interconnect layer 24 is formed on the interlayer insulating film 21 to a thickness of, for example, 800 nm, a silicon nitride film 26 is further formed thereon to a thickness of, for example, 50 nm and thus an interlayer insulating film 27, which serves as an insulating film between upper and lower interconnects, (the interlayer insulating film 27 is hereinafter referred to as ILD, which is an abbreviation of Inter Level Dielectrics) is formed. The silicon nitride film 26 exerts a function as an etching stopper in a later step.

A resist mask (not shown) in which openings are formed at sites where contact holes are bored is formed on the ILD 27 by means of ordinary resist coating and lithography techniques, and with the resist mask in place, etching is applied with the result that a portion of the contact hole 28 is formed in the silicon nitride film 26. The silicon nitride film 26 was formed so that a diameter of the contact hole 28 was, for example, 0.3 µm.

After the contact hole 28 is formed, the resist mask is removed. Subsequently, as shown in FIG. 3(2), an interlayer insulating film 29 between interconnects in the same layer (the interlayer insulating film 29 is hereinafter referred to as IMD, which is an abbreviation of Inter Metal Dielectrics), which covers a part of the contact hole 28, is formed on the silicon nitride film 26 to a thickness of, for example, 500 nm with a silicon oxide film deposited by means of, for example, a plasma enhancement CVD method.

After deposition of the silicon oxide film, a resist mask (not shown) in which openings are formed at sites where trenches are bored is formed on the IMD 29 by means of ordinary resist coating and lithography techniques and with the resist mask in place, etching is applied with the result that a trench 30 is formed in the IMD 29. In the etching to form the trench 30, the silicon nitride film 26 serves as an etching stopper. Then, using the silicon nitride film 26 as an etching mask, the oxide film 25 is etched to form a contact hole 28, which leads to the lower layer interconnect 24, at the bottom of the trench 30. A recess 31 comprising the contact hole 28 and the trench 30 is formed in this way. The trench 30 was formed so as to have a width of, for example, 0.5 µm. Thereafter, the resist mask is removed.

Then, as shown in FIG. 3(3), a lower portion 33 of a metal material mass is formed with tungsten or aluminum on the bottom side of the contact hole 28 of the recess 31 by means of a CVD method. CVD conditions are that, for a case where the lower portion 33 is formed with tungsten, tungsten hexafluoride ($WF_6$) and mono-silane ($SiH_4$) are used as a source gas, and a film forming temperature is set to a temperature of from 150° C. to 250° C. and, for case where the lower portion 33 is formed with aluminum, dimethyl aluminum hydride [$(CH_3)_2AlH$] is used as a source gas and a film forming temperature is set to a temperature of from 150° C. to 250° C.

A barrier metal layer 32 is, thereafter, formed on inner walls of the recess 31 comprising the trench 30 and the contact hole 28 upward from the lower portion 33 of the metal material mass with, for example, titanium nitride deposited by DC magnetron sputtering to a thickness of, for example, 70 nm. At this time, the barrier metal layer 32 is also deposited on the IMD 29. The barrier metal layer 32 are formed, for example, under the following conditions: A process gas comprising argon (Ar) at a flow rate of 20 sccm and nitrogen ($N_2$) at a flow rate of 70 sccm is used, a pressure of a film forming atmosphere and a temperature in the film forming are respectively 0.3 Pa and 200° C., and DC power is set at 12 kV, wherein sccm hereinafter indicates a volume flow rate ($cm^3$/min) in the standard condition.

Following formation of the barrier metal layer 32, a seed layer 34 is formed on the barrier metal layer 34 by copper deposition, for example, 100 nm in thickness again with DC magnetron sputtering. An example of formation conditions of the seed layer 34 was that argon (Ar) at a flow rate of 50 sccm was used as a process gas, a pressure of a film forming atmosphere was set to 0.2 Pa and a film forming temperature was set to 200° C. and a supplied DC power was set to 12 kV. In the course, since a lower portion 33 of the metal material mass has been formed on the bottom side of the contact hole 28, the contact hole 28 has a low aspect ratio at the time when the seed layer 34 is formed and a step coverage performance of the seed layer 34 on upper side walls of the contact hole 28 is improved.

As shown in FIG. 3(4), copper is filled into the interiors of the contact hole 28 and the trench 30 by means of an electrolytic plating method. In the electrolytic plating, copper is grown on the seed layer 34. Unnecessary copper on the IMD 29 is then removed by CMP to form an upper portion 35 of the metal material mass in the interior of the contact hole 28 on the lower portion 33 of the metal material mass and besides, an upper layer interconnection 36 is formed in the interior of the trench 30. A plug 37 is thus constructed from the lower and upper portions 33 and 35 of the metal material mass. Note that in the above described CMP, the barrier metal layer 32 (not shown) on the IMD 29 is also eliminated.

Figure 3:
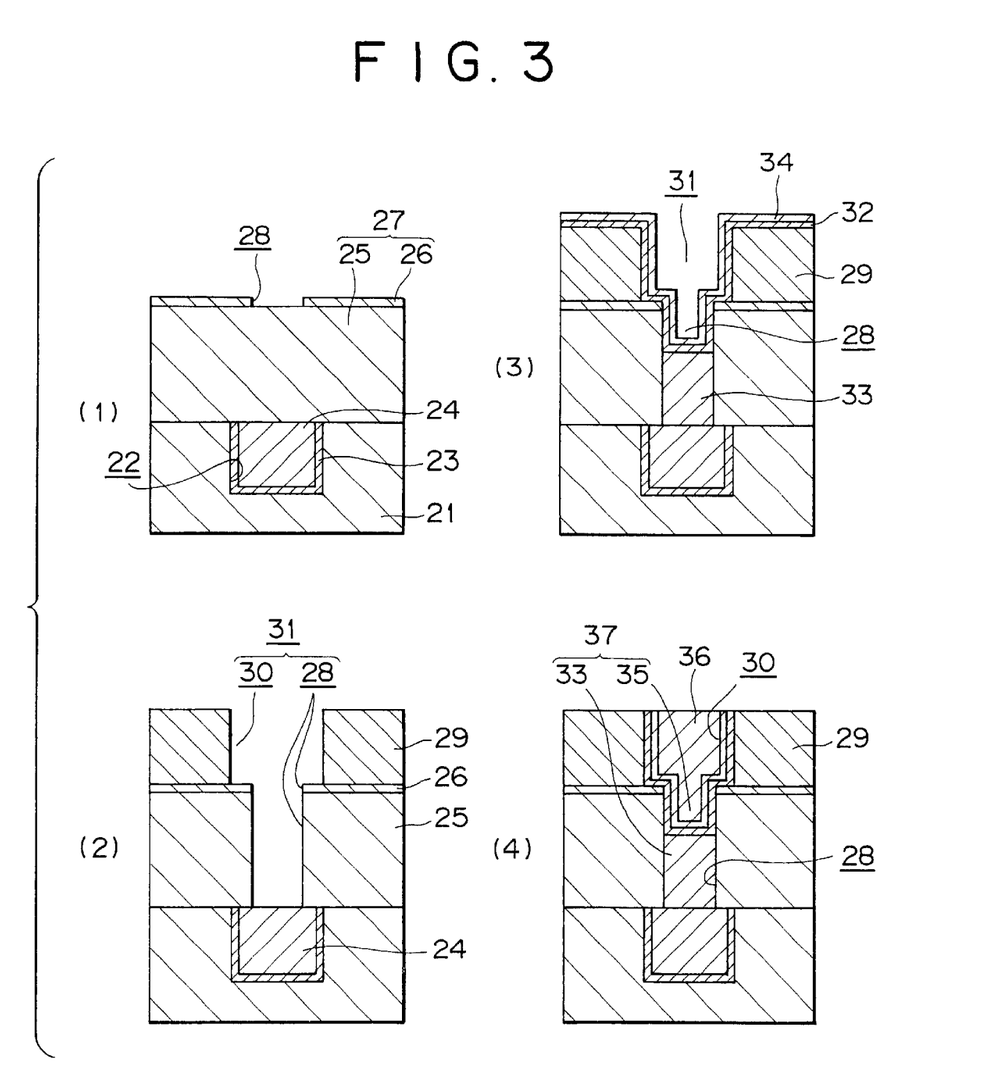

In the second fabrication process for the interconnection structure, an aspect ratio of the contact hole of the recess 31 is reduced by formation of the lower portion 33 of the metal material mass formed by deposition of a metal in the interior of the recess 31 and therefore, a step coverage performance of the seed layer 34 formed by electrolytic plating in a later stage is improved. As a result, since a metal (copper) is satisfactorily filled into the recess 31 by means of electrolytic plating, no void occurs.

In the embodiment of the first fabrication process for the interconnection structure, the case where the lower layer interconnect 24 is formed with copper, but even if the lower layer interconnect 24 is made of a metal more unstable and higher in the order of ionization series than copper, the lower portion 33 of the metal material mass can be formed with copper similar to the case described above. In a case where the lower interconnect 24 is made of aluminum, substitution plating is effected on an aluminum surface by using a plating solution including copper ions and, thereby, the aluminum surface can be covered with copper. Thereafter, when copper is filled into the interior of the contact hole 28 by electroless plating according to the process used in the above described embodiments, the lower portion of the metal material mass can be formed. As metals that are more ignoble than copper, the following metals that are higher in the order of ionization series than copper but are inactive with water at room temperature can be employed: in addition to Al, zinc, chromium, iron, cobalt, nickel, tin, lead, antimony, bismuth and the others.

In the above described electroless plating, nickel, chromium, gold, silver, palladium, platinum and the others can be used when an underlying layer is aluminum.

The barrier metal layer 32 described in the embodiments of the first and second embodiments can be formed using one or more selected from the group consisting of titanium nitride, titanium-tungsten, tantalum, tantalum nitride, tungsten, tungsten nitride and tungsten nitride silicide and in a case where a plurality of the barrier layer materials are used, the barrier metal layer 32 is formed in a structure of stacked layers. The barrier metal layer can be fabricated by means of any of various methods or processes such as a CVD method and other film forming means without a specific limitation to sputtering.

The copper seed 34 can be formed by means of any of a number of various processes or methods such as the CVD method and other film forming means without a specific limitation to sputtering.

In the embodiments of the first and second fabrication processes, the case of a so-called dual Damascene structure is described, but the fabrication processes can also be applied to a case where a trench or a contact hole is singly formed. Besides, the IMD 29 and ILD 27 each are not limited to an silicon oxide film formed by the plasma enhancement CVD method, but, for example, other insulating films each made of a low dielectric constant of 3.5 or lower can be used instead. Alternatively, the IMD 29 and ILD 27 each may be a combination of the silicon oxide film and a low dielectric constant film.

To sum up, according to an interconnection structure of the present invention, a lower portion of a metal material mass and a lower interconnect are directly connected to each other with no barrier metal interposed therebetween and therefore, a contact resistance is low as compared with a related interconnection structure in which a barrier metal layer is also formed at the bottom of a contact hole. Hence, a high signal transmission speed is realized and a high performance interconnect structure is also achieved.

According to the first fabrication process for an interconnection structure, since a lower portion of a plug is formed after a portion, formed on the bottom, of a barrier metal layer formed in a recess is removed, the lower portion of a metal material mass can be formed by electroless plating. Furthermore, since an aspect ratio of the recess can be reduced by formation of the lower portion of the metal material mass, a step coverage performance of a seed layer formed by electrolytic plating in a later step can be improved. As a result, since a metal can satisfactorily be filled into the recess by electrolytic plating, no void occurs in the recess. Accordingly, an interconnection structure with high reliability can be formed. Besides, since electrolytic plating is faster in a plating speed than a filling process of a metal only by electroless plating into a contact hole, a trench and others each with a high aspect ratio, improvement of a through-put can be realized. In addition, since less of an additive is required for an electroless plating solution than for an electrolytic plating solution, then, in turn less impurities are incorporated into a plated film with the electroless plating solution than with the electrolytic plating solution, from which reduction in stress in the plated film is expected.

According to the second fabrication process for an interconnection structure, since an aspect ratio of a recess is reduced by formation of a lower portion of a metal material mass formed with deposition of a metal into the interior of the recess, a step coverage performance of a seed layer formed by electrolytic plating in a later step is improved. As a result, since the metal is satisfactorily filled into the recess by electrolytic plating, no void occurs. Accordingly, an interconnection structure with high reliability can be achieved.

What is claimed is:

1. A fabrication process for an interconnection structure comprising the steps of:

forming a barrier metal layer on inner walls of a recess, which is connected onto a conductive material mass formed in an insulating film, and which is formed in the insulating film;

exposing the conductive material mass at a bottom of the recess by removing the barrier metal layer formed on the bottom of the recess;

forming a lower portion of a metal material mass by filling a metal into an interior of the recess;

forming a seed layer by means of an electrolytic plating method on inner walls of the recess upward from the lower portion of the metal material mass; and forming an upper portion of the metal material mass by filling the metal into the interior of the recess by means of the electrolytic plating method.

2. A fabrication process for an interconnection structure according to claim 1, wherein the lower portion of the metal material mass is formed by means of an electroless plating method.

3. A fabrication process for an interconnection structure according to claim 1, wherein the recess includes a contact hole, a trench, or a trench and a contact hole formed at a bottom of the trench.

4. A fabrication process for an interconnection structure according to claim 2, wherein the recess includes a contact hole, a trench, or a trench and a contact hole formed at a bottom of the trench.

5. A fabrication process for an interconnection structure comprising the steps of:

forming a lower portion of a metal material mass by deposition of a metal into an interior of a recess, which is connected onto a conductive material mass formed in an insulating film, and which is formed in the insulating film;

forming a barrier metal layer on inner walls of the recess upward from the lower portion of the metal material mass;

forming a seed layer by means of an electrolytic plating method on the inner walls of the recess; and forming an upper portion of the metal material mass by filling the metal into the interior of the recess by means of the electrolytic plating method.

6. A fabrication process for an interconnection structure according to claim 5, wherein the lower portion of the metal material mass is formed by means of a CVD method.

7. A fabrication process for an interconnection structure according to claim 5, wherein the recess includes a contact hole, a trench, or a trench and a contact hole formed at a bottom of the trench.

8. A fabrication process for an interconnection structure according to claim 6, wherein the recess includes a contact hole, a trench, or a trench and a contact hole formed at a bottom of the trench.

* * * * *